United States Patent
Cohen Gadol

(10) Patent No.: US 12,235,330 B2
(45) Date of Patent: Feb. 25, 2025

(54) METHOD AND SYSTEM TO DETERMINE ELECTRICAL FAULTS

(71) Applicant: Moshe Cohen Gadol, Rishon Lezion (IL)

(72) Inventor: Moshe Cohen Gadol, Rishon Lezion (IL)

(73) Assignee: ESP LTD., Rishon Lezion (IL)

( * ) Notice: Subject to any disclaimer, the term of this patent is extended or adjusted under 35 U.S.C. 154(b) by 133 days.

(21) Appl. No.: 18/012,949

(22) PCT Filed: Jun. 24, 2021

(86) PCT No.: PCT/IB2021/055620
§ 371 (c)(1),
(2) Date: Dec. 26, 2022

(87) PCT Pub. No.: WO2021/260624
PCT Pub. Date: Dec. 30, 2021

(65) Prior Publication Data
US 2023/0147123 A1    May 11, 2023

Related U.S. Application Data

(60) Provisional application No. 63/043,144, filed on Jun. 24, 2020.

(51) Int. Cl.
| | |
|---|---|
| G01R 31/55 | (2020.01) |
| G01R 19/165 | (2006.01) |
| G01R 31/327 | (2006.01) |
| G01R 31/52 | (2020.01) |
| G01R 31/54 | (2020.01) |
| G08B 21/18 | (2006.01) |
| H02H 7/22 | (2006.01) |

(52) U.S. Cl.
CPC ....... *G01R 31/55* (2020.01); *G01R 19/16571* (2013.01); *G01R 19/1659* (2013.01); *G01R 31/3277* (2013.01); *G08B 21/185* (2013.01); *H02H 7/22* (2013.01); *G01R 31/52* (2020.01); *G01R 31/54* (2020.01)

(58) Field of Classification Search
CPC ............. G01R 31/55; G01R 19/1659; G01R 19/16571; G01R 31/52; G01R 31/54; G01R 31/3277; G08B 21/185; H02H 7/22; H02H 3/42; H02H 3/38; H02H 3/40; H02H 5/10
USPC ...................................... 324/355
See application file for complete search history.

(56) References Cited

U.S. PATENT DOCUMENTS

| | | | | |
|---|---|---|---|---|
| 2006/0238363 A1* | 10/2006 | Johnson | ............ | G01R 31/3277 340/638 |
| 2009/0251011 A1* | 10/2009 | Suardi | .................... | H01H 33/38 307/143 |
| 2014/0167729 A1* | 6/2014 | McCasland | ............ | G01R 31/67 324/66 |
| 2015/0316597 A9* | 11/2015 | McCasland | ............ | G01R 31/58 324/66 |

(Continued)

*Primary Examiner* — Raul J Rios Russo
(74) *Attorney, Agent, or Firm* — Rivka Friedman

(57) ABSTRACT

Methods and systems provide an indication that a loose connection and/or fault occurred in a breaker box or other electrical connecting device. The method includes calculating normal resistance for circuits within a breaker box when a current drawing load is present, and monitoring increases in voltage drop of the circuits to detect whether the increase is due to increased current flow or a faulty connection.

20 Claims, 3 Drawing Sheets

(56) References Cited

U.S. PATENT DOCUMENTS

2017/0269143 A1\* 9/2017 McCasland ............ G01R 31/67
2022/0102958 A1\* 3/2022 Hirsh ...................... H02H 3/04

\* cited by examiner

METHOD AND SYSTEM TO DETERMINE ELECTRICAL FAULTS

TECHNICAL FIELD

The present invention is directed to determining electrical faults within multi-circuit and multi-phase environments.

BACKGROUND OF THE INVENTION

Industrial power circuits typically include use of circuit panels, junction boxes, and bus bars through which electricity flows, frequently 24 hours per day. These circuits, including their components, generally require preventive maintenance to prevent a fault which may bring down the circuit and/or may cause damage to connected equipment. The preventive maintenance may also serve to prevent electrical fires.

Providing continuous preventive maintenance may be very costly and may involve the use of vast resources. As a result, existing measures generally involve, every few years, going through all the circuit panels and other circuit components and checking for loose connections. This may involve physically checking all the connection screws and tightening them if they are loose, and/or performing thermographic checks to detect hot spots which may be caused by, among others, loose connections.

A problem with the physically inspection and screw tightening is that it is very difficult to corroborate that all the circuit panels and other components have been inspected and that all screws are secured. A problem with thermographic inspection is that the accuracy of the inspection is dependent on the skill of the person performing the inspection, and the circuit must be connected to a full load in order to allow for the detection of hot spots. Another problem is that the physical inspection and the thermographic inspection are only carried out periodically, sometimes over an extended period of time, and faults may result during the intermediate period of time. Furthermore, the inspections are carried out only on components such as the circuit panels, the junction boxes, and the bus bars, and not on the whole circuit.

The purpose of the present invention is to provide a solution to the abovementioned problems.

SUMMARY OF THE INVENTION

The present invention provides methods and systems for automatically detecting and alerting when an increase in resistance occurs in a circuit within a breaker box. The present invention continuously samples voltage drop, and if a voltage drop increases above a threshold level without a corresponding increase in current in the circuit, it is identified as a possible loose wire and/or other fault, and an alarm is sent.

Embodiments of the invention are directed to a method for detecting increased resistance in a circuit, the method comprising: sampling a voltage drop between an input point and an output point within a breaker box for at least one of circuit, detecting one the circuit with an increased voltage drop from a threshold value, sampling an input current at an input point of a breaker box, the input point connected to a same phase as the increased voltage drop; and when the input current increases above a threshold value and comprises a sufficiently similar phase angle and time synchronization as the increased voltage drop calculating a loaded resistance of the detected circuit by dividing the increased current by the detected voltage drop.

Optionally the method is such that the calculating of the loaded resistance further comprised calculating a plurality of values of loaded resistance, and a reference value of loaded resistance is calculated by a mathematical function performed on the plurality of loaded resistance values.

Optionally the method is such that the mathematical function is chosen from a group including mean, average, weighted average, weighted mean, median, and/or ignoring outliers.

Optionally the method is such that wherein the plurality of circuits belong to a single phase of a three phase signal.

Optionally the method is such that the detecting of one the circuit with an increased voltage drop corresponding to the increase in input current further comprising correlating a timing and a phase angle between the increased voltage drop and the increase input current.

Embodiments of the invention are directed to a method, the method comprises sampling a voltage drop within a breaker box for at least one of the plurality of circuits, detecting a circuit among the plurality of circuits with an increased voltage drop above a threshold value in a specific electrical phase, sampling an input current to the breaker box of the same phase as the increased voltage, and if no increased current occurred corresponding to the increased voltage drop in both time synchronization and phase angle generating an alarm.

Optionally the method is such that further comprising generating an alarm when a resistance for the circuit calculated by dividing the voltage drop by the increased current is above a threshold level of a loaded resistance for the detected circuit.

Optionally the method is such that further comprising generating an alarm when the correlated increased current is greater than a threshold percentage of a maximum value for current in a circuit breaker for the detected circuit.

Optionally the method is such that further comprising calculating a power consumption of at least one circuit in the breaker box by continuously multiplying a detected voltage drop by corresponding increased current, and when the power consumption is greater than a threshold value performing at least one action chosen from a list of actions including generating an alarm, storing a time series of the power consumption values, and reporting in real-time the power consumption values.

Optionally the method is such that further comprising generating a time series data base of values of the sampled current for at least one of the plurality of circuits.

Embodiments of the invention are directed to a system for detecting faults in a breaker box comprising a processor comprising a CPU, communications interface, and a memory, a voltage sampling interface connected to entry points and exit points of circuits within the breaker box, a voltage comparator for calculating a voltage drop from the entry point and exit point voltages, a current sampling interface, and the processor programmed with executable instructions to receive time series of current data and corresponding voltage drop data for the at least one circuit, and to calculate a loaded resistance of the at least one circuit.

Optionally the system is such that further comprising generating an alarm when a resistance for the circuit calculated by dividing the voltage drop by the increased current is above a threshold level of a loaded resistance for the detected circuit.

Optionally the system is such that further comprising generating an alarm when the corresponding increased current is greater than a threshold percentage of a maximum value for current in a circuit breaker for the detected circuit.

Optionally the system is such that further comprising calculating a power consumption of at least one circuit in the breaker box by continuously multiplying a detected voltage drop by corresponding increased current, and performing at least one action chosen from a list of actions including generating an alarm when the power consumption is greater than a threshold value, storing a time series of the power consumption values, and reporting in real-time the power consumption values.

Optionally the system is such that further comprising generating a time series data base of values of the sampled current for at least one of the circuits.

Optionally the system is such that wherein the calculating of the loaded resistance further comprised calculating a plurality of values of loaded resistance, and a final value of loaded resistance is calculated by a mathematical function performed on the plurality of values.

Optionally the system is such that wherein the mathematical function is chosen from a group including mean, average, weighted average, weighted mean, median, and/or ignoring outliers.

Optionally the system is such that wherein the at least one circuits belong to a single phase of a three phase signal.

Optionally the system is such that the detecting of one the circuit with an increased voltage drop corresponding to the increase in input current further comprising correlating a timing and a phase angle between the increased voltage drop and the increase input current.

This document references terms that are used consistently or interchangeably herein. These terms, including variations thereof, are as follows:

A "computer" and/or "processor" includes machines, computers and computing or computer systems (for example, physically separate locations or devices), servers, computer and computerized devices, processors, processing systems, computing cores (for example, shared devices), and similar systems, workstations, modules and combinations of the aforementioned. The aforementioned "computer" may be in various types, such as a personal computer (e.g., laptop, desktop, tablet computer), or any type of computing device, including mobile devices that can be readily transported from one location to another location (e.g., smart phone, personal digital assistant (PDA), mobile telephone or cellular telephone).

A "server" is typically a remote computer or remote computer system, or computer program therein, in accordance with the "computer" defined above, that is accessible over a communications medium, such as a communications network or other computer network, including the Internet. A "server" provides services to, or performs functions for, other computer programs (and their users), in the same or other computers. A server may also include a virtual machine, a software based emulation of a computer.

Unless otherwise defined herein, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Attention is now directed to the drawings, where like reference numerals or characters indicate corresponding or like components. In the drawings.

DETAILED DESCRIPTION OF THE INVENTION

Figure 1:
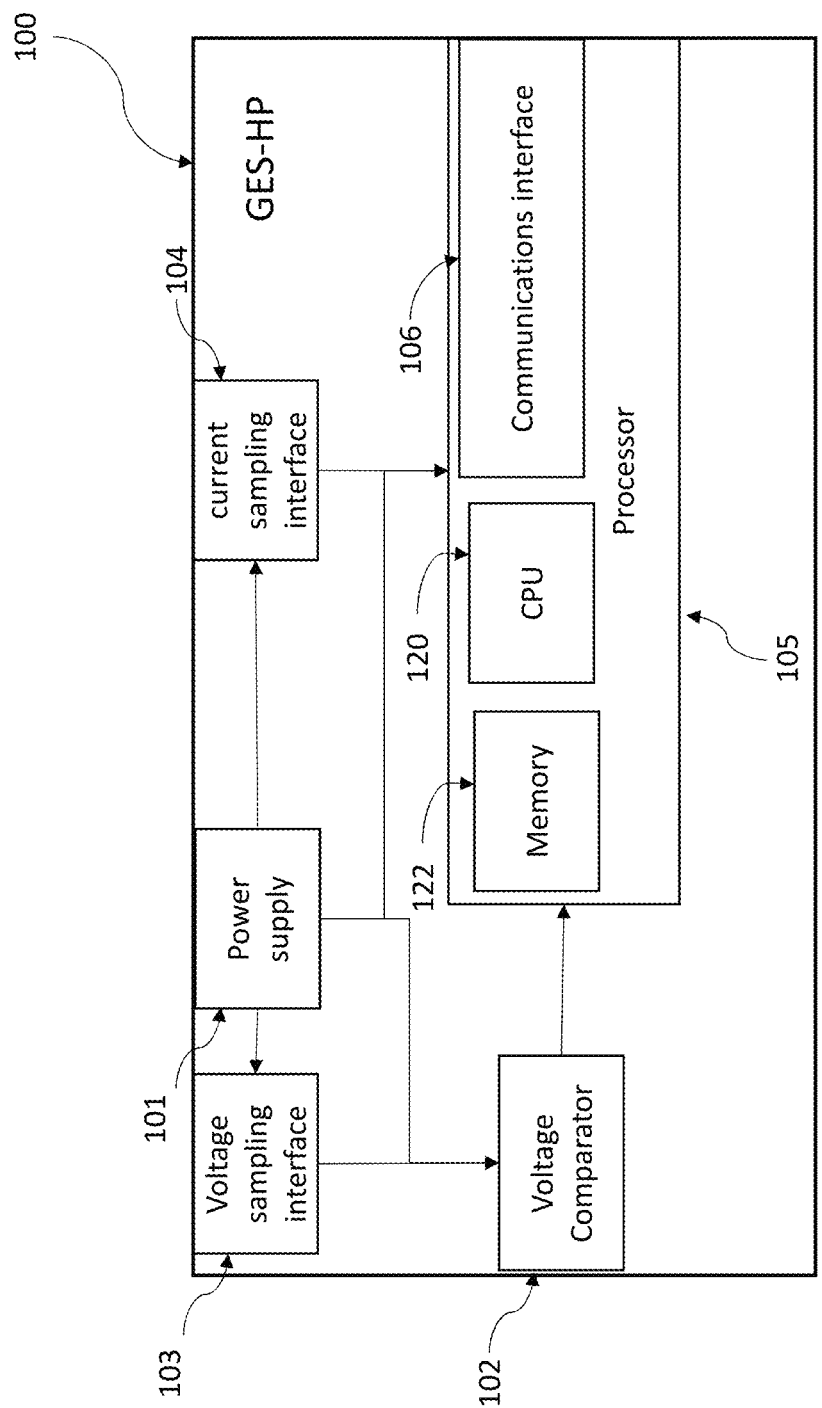
FIG. 1 is a block diagram of a GESHP, according to some embodiments of the current invention.

Before explaining at least one embodiment of the invention in detail, it is to be understood that the invention is not necessarily limited in its application to the details of construction and the arrangement of the components and/or methods set forth in the following description and/or illustrated in the drawings. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "phase", "module" or "system." Furthermore, aspects of the present invention may take the form of a computer program product embodied in one or more non-transitory computer readable (storage) medium(s) having computer readable program code embodied thereon.

FIG. 1 is a block diagram of a hot point system (GESHP) 100, which may be used to detect loose connections and other faults in electric power circuits, according to an embodiment of the present invention. The GESHP 100 includes a power supply 101, a voltage comparator 102, a voltage sampling interface 103, a current sampling interface 104, and a processor 105. Optionally, the GESHP 100 includes at least one voltage and/or at least one current sensor.

In some embodiments, a GESHP 100 may be connected to a breaker box and collect data from the breaker box, for example values of current, relative voltage levels, and/or electric wave phase angles. The term "breaker box" used herein refers to any electrical connection device that receives voltage and/or current from an external source, for example power lines of an electric supply company, and supplies the voltage and/or current to a local consumer. For example a breaker box may be an installation at an industrial site with numerous electric motors and other electric devices that are connected to output points of the breaker box. Optionally a breaker box may receive and distribute three phase electricity.

In some embodiments, input voltage supplied to GESHP 100, for example 220-240 volt AC, may be rectified and/or converted by power supply 101 to a suitable voltage for operation of all components described herein.

Figure 2:
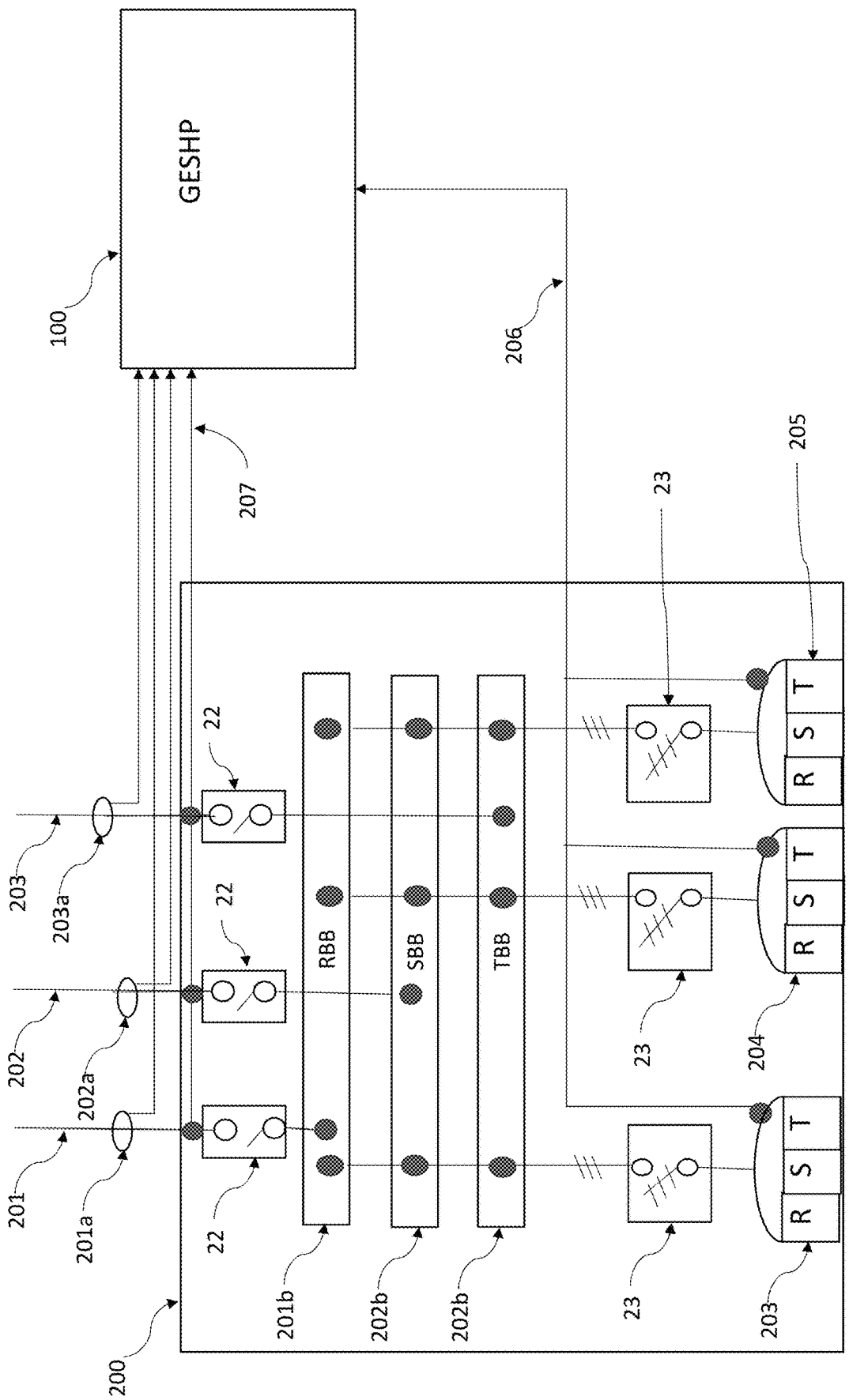
FIG. 2 is a schematic illustration of a GESHP connected to a breaker box, according to some embodiments of the current invention.

In some embodiments voltage sampling interface 103 may comprise sensors and/or connections to sensors for sampling voltage levels of a plurality of voltage lines and may transmit the voltage values to voltage comparator 102, as described in FIG. 2.

Optionally, the voltage value may be relative to a reference point. Optionally the voltage values may include metadata identifying the specific source of the samples, a time stamp of each sample, phase, phase angle, and/or other data.

In some embodiments current sampling interface 104 may comprise sensors and/or connections to sensors for sampling current levels of input lines and may transmit the values of current to processor 105, as described in FIG. 2.

Optionally, the current value may include phase identification, phase angle, source of the samples, a time stamp of each sample, phase, phase angle, and/or other data.

Optionally, the current sensors comprise ring current sensors. Optionally, separate sensors may be dedicated to collecting data from each of three phases entering a breaker box.

In some embodiments voltage comparator 102 may comprise a mechanism for receiving multiple voltage signals and computing a voltage delta between two signal sources. Optionally the voltage signals may be voltages, digital encoded signals, and/or any type of signal representing a voltage level. For example, voltage comparator 102 may calculate a delta voltage between an entry point and exit point of circuits within a breaker box, as described in FIG. 2.

Optionally voltage comparator 102 may comprise communication devices for transmitting data to processor 105. Optionally, the data may comprise the calculated delta voltages, time stamps, voltage source identity, phase, phase angles, and/or any other data. Optionally the interface between voltage comparator 102 and processor 105 may be digital, analog, and/or a combination thereof.

In some embodiments processor 105 may comprise a computing platform, including communication interface 106, memory 122, a CPU 120, and/or other computing facilities as described in FIG. 2.

FIG. 2 is a schematic illustration of a GESHP connected to a breaker box, according to some embodiments of the current invention.

In some embodiments breaker box 200 may comprise input lines 201, 202, and 203, connected optionally via circuit breakers 22 to breaker bars 201b, 202b, and 203b respectively. Circuits 203, 204, and 205 may each connect to each of breaker bars 201b, 202b, and 203b. In some embodiments some or all circuits may be three phase or single phase. Optionally circuit breaker 23 may be connected between breaker bars 201b, 202b, and 203b, and circuits 203, 204, and 205. Optionally breaker box 200 may comprise 3-5, 5-10, 10-20, 20-40, 40-100 or any other number of circuits.

In some embodiments current sensors 201a, 202a, and 203a may be attached to input points either within or outside of breaker box 200. Current sensors 201a, 202a, and 203a may be part of and/or attached to current sampling interface 104 of GESHP 100, and may sample current of electric supply wires, for example in a three phase system, input lines 201, 202, and 203. Those familiar with the art, may refer to the three phase wires as "R", "S", and "T".

Sampling

As used herein, the term "sampling" refers to a device generating a data parameter representative of a measured phenomenon, for example voltage, phase angle, and/or current. The data parameter may be generated at regular time intervals, for example once per Pico second, micro second, fraction of a second, 1-10 seconds, 10-20 seconds, 20-30 seconds, 30-60 seconds, 1-5 minutes, 5-30 minutes, 30-60 minutes, 1-2 hours, 2-24 hours, 1-2 days, and/or any other time interval and/or range.

In some embodiments voltage sampling interface 103 may comprise or be connected to input voltage sensors 207. Input voltage sensors 207 may comprise separate sensors for each input lines 201, 202, and 203.

In some embodiments, voltage sampling interface 103 may comprise or be connected to voltage sensors 206, wherein voltage sensor 206 may comprise a separate voltage sensor for each of a plurality of circuits at an output point of breaker box 200.

Processor 105

The GESHP 100 may comprise processor 105 comprising a central processing unit (CPU) 120 linked to memory 122. The CPU 120 is in turn, linked to components such as voltage comparator 102, and current sampling interface 104. While these components are the most germane to processor 105, other components are permissible.

The CPU 102 is formed of one or more processors, including hardware processors, and performs the processes (methods) of the invention, for example, the process of FIG. 3, which is detailed below. For example, CPU 120 may include x86 Processors from AMD (Advanced Micro Devices) and/or any other CPU.

Memory 122 may store machine-executable instructions executed by the CPU 120 for performing the processes of the invention. Memory 122, for example, may also provide temporary storage for intermediate computations.

Communications Interface 106

Communications interface 106 may facilitate communication links, including communication between components of GESHP, and communications between GESHP and other communicating platforms. Communications interface may comprise cellular, wired and/or wireless links, for example Wi-Fi, Bluetooth, Ethernet, and may support communications protocols, for example TCP/IP.

For example, communications interface 106 may sends alarms and/or alerts generated by the processes of GESHP to designated destinations to inform of possible increased resistance of one or more circuits within breaker box 200.

Communications interface 106 may also receive communications, such as when processor 105 is being programmed. For example, communications interface 106 may allow a user of a computing platform to input configuration data. Configuration data may also be loaded into memory 122 along with program instructions.

Configuration Data

Configuration data may include for example associating current sensors 201a with input line 201, current sensor 202a with input line 202, and input sensor 203a with input line 203, and/or associating each of breaker bars 201a, 201b, and 201c with one of input lines 201, 202, and 203, and associating individual output voltage sensors 206 with circuits 203, 204, or 205. Configuration data may further comprise a maximum and/or threshold current value of circuit breakers 22 and/or 26, a threshold for generating alarms, and the like. The association of the various components may enable processor 105 to identify specific circuits with loose or problematic connections.

Definition of Terms

Any reference to calculations, detections, recordings, sampling, actions, methods, and/or process performed by processor MESHP 100, processor 105, and or CPU 126 refer to instructions stored in memory 122 executing on CPU.

"Linked" as used herein, includes both wired and/or wireless links, either direct or indirect. As used herein, a "module", for example, includes a component for storing instructions (e.g., machine readable instructions), for example memory 122, and for performing one or more processes, and including or associated with processors, e.g., the CPU 120, for executing the instructions.

The term "corresponding" and/or "correlating", when applied to voltage and/or current parameters refers to a change occurring in both parameters within a window of time from each other, for example within 1-1000 Pico seconds, 1-1000 micro seconds, a fraction of a second, 1-2 seconds, and/or between 1,2, 3, or more sampled values. Corresponding parameter values may also that display about the same phase shift, the term "about" referring to within a range of plus or minus 0.1-1%, 1-2%, 2-4%, 4-6%, 6-8%, 8-10%, or any fraction of the stated ranges.

The term "associate" may be applied to components of breaker box 200, and may indicate a connection to a common circuit and/or phase.

The terms "steady state" and "threshold" when applied to parameters of voltage and/or current refers to a value calculated by processor 105 wherein a time series of values for a parameter are stored and a steady state or threshold value is calculated based on a mathematical operation, for example an average, mean, or other mathematical operations or combinations thereof, on a series of values, for example when it is known that no load is applied to a circuit, for example during a time period when load drawing equipment is not in use, e.g. during the night, or for example choosing a series of values that are within a range of each other and of lower value than other series.

The term "threshold" may refer to a value that is calculated by processor 105, a default value stored in memory 122, a percentage or a multiple of a value for example loaded resistance, and/or a parameter input by a user.

The term "loaded resistance" refers to the calculated resistance between an input point of a circuit and an output point of the same circuit when a load that draws current, for example an electric motor or any other electric device, is applied to the output point of the circuit.

The term "fault threshold" refers to a resistance parameter for each circuit that may be calculated by processor 105, input by a user, and/or an initial default parameter loaded into memory 122. For example, the fault threshold may be a percentage of the maximum current rating of a circuit breaker in the circuit, a percentage of the loaded resistance, and/or any other calculated or determined value. The term may also refer to a level of power, calculated using Ohm's law, by multiplying voltage drop by current.

Calculating Loaded Resistance

By way of example, loaded resistance of circuit 203 is calculated. The same process may be applicable to any other circuit within breaker box 200.

For example, to calculate the loaded resistance of circuit 203, an increase in voltage drop is detected by voltage comparator 102 based on input from voltage sampling interface 103 receiving input from voltage sensors 206 and 207. Voltage drop is a value calculated by processor 105 and/or by voltage comparator 102 by calculating for circuit 203 the difference between voltage parameters recorded by input voltage sensors 207 and the associated output voltage sensors 206. For example, the increased voltage drop may be detected in input line 201.

Processor 105 then searches values of sampled current from current sensor with the same phase as the increased voltage drop, for example in our case current sensor 201*a*, and detects whether a corresponding increase in current with the same phase angle and time synchronization as the increased voltage drop occurred.

When a corresponding voltage drop and current increase is detected, the loaded resistance is calculated by dividing the increased current by the voltage drop, according to Ohm's law. The calculation may be performed multiple times, and a mathematical operation may be performed on the series of values of loaded resistance to calculate referenced value of loaded resistance, which may be stored for use in detecting increased resistance due to loose connection and/or other faults.

The loaded resistance of each circuit may be calculated automatically by processor 105, for example numerous times, for example at initial start-up of GESHP 100, and may be automatically recalculated if and/or when a change in value is detected. In some embodiments, an initial and/or default value of loaded resistance for some or all circuits may be input to the GESHP.

Identifying Increased Circuit Resistance

GESHP 100 may detect within a circuit increased resistance and/or increased power consumption, which may be an indication of a loose or otherwise malfunctioning connection, fuse, breaker, component, and/or section of the circuit.

The process of identifying increased resistance within a circuit may begin after the process of calculating referenced loaded resistance and continue with the steps listed below. Optionally, identifying increased resistance within a circuit may comprise similar and/or identical steps in the process of calculating loaded resistance, with the following added steps.

The voltage drop is calculated for each circuit continuously, for example with each set of corresponding voltage measurement, or once every period of time, for example every second, every minute, every hour, every day, and/or any other time interval. If an increased voltage drop is detected where no corresponding current increase is detected, or if calculation of load resistance rises above a threshold, actions may be taken to alert that a fault may be present in the circuit.

The actions may include transmitting an alert to user computing device(s), sounding an audible alarm at or near breaker box 200 or any other location, recording relevant parameters in a log file, and/or any other action.

The detection of increased circuit resistance may further comprise real time and/or continuous reporting of power consumption of at least one circuit in breaker box 200. For example, once the reference loaded resistance is known, power can be calculated by the formula:

$$P = U^{\wedge}2 * RL$$

Where:
P=power
U=increased current
RL=referenced loaded resistance

Optionally, the power consumption of a circuit may also be calculated by the formula:

$$P = U*V$$

Where:
V=voltage drop.
U=increased current

Figure 3:
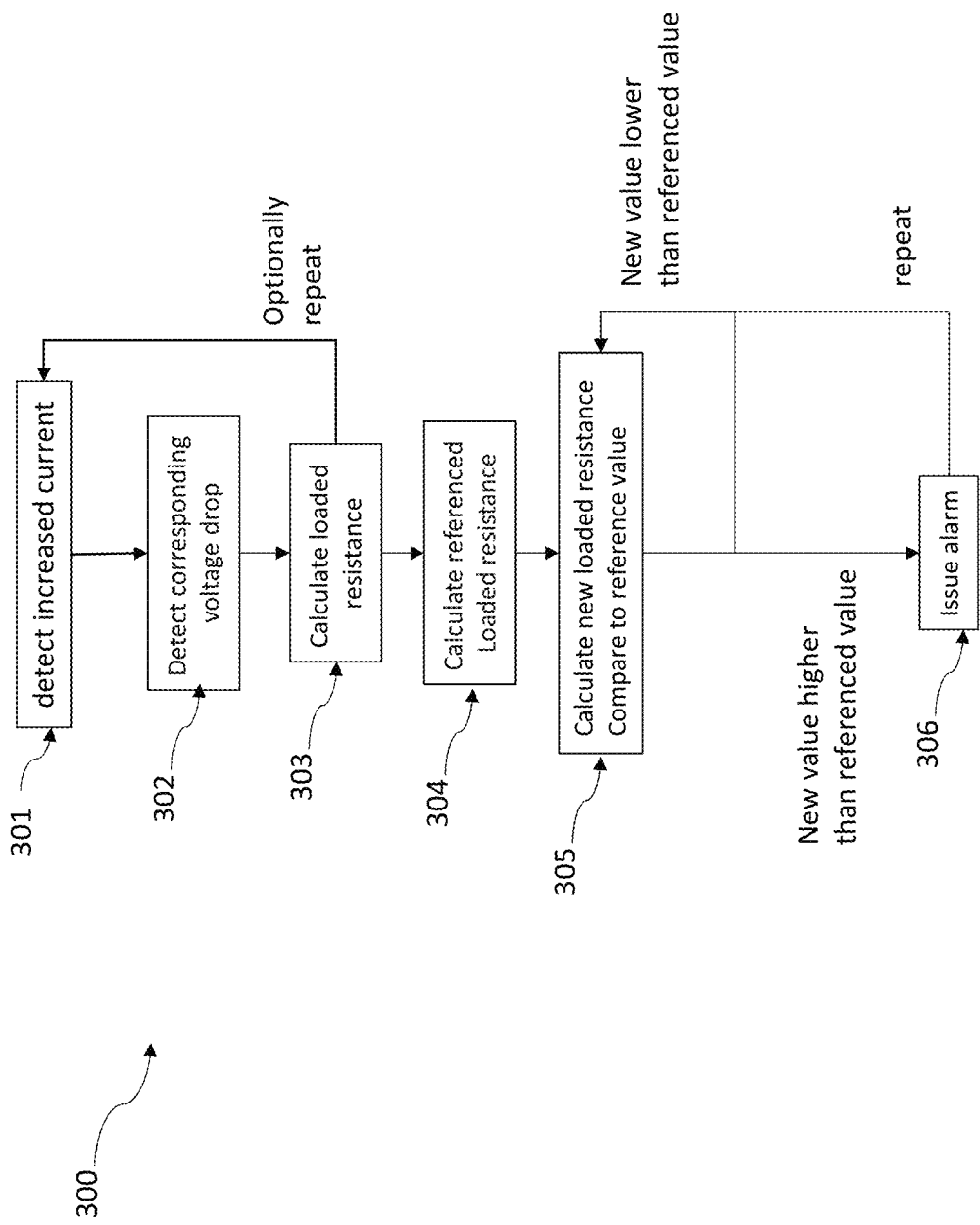
FIG. 3 is a flow diagram detailing processes of a GESHP according to some embodiments of the invention.

FIG. 3 is a flow diagram detailing processes in accordance with embodiments of the invention.

In some embodiments, the process begins at a block 301, where input current is sampled by current sampling interface 104, and an increase in the input current above a threshold is detected and recorded by processor 105

The process continues with block 302, where voltage drop of the same phase for a plurality of circuits is recorded and examined by processor 105, and a voltage drop corresponding to the increased current is detected.

The process continues with block 303, where a loaded resistance is calculated by processor 105 by dividing the increase in current by the corresponding voltage drop.

Optionally, blocks 301-303 may be repeated at least twice for the same circuit, and a referenced loaded resistance value is calculated by processor 105 in block 304 by performing a mathematical operation of the series of loaded resistance values.

Optionally the mathematical function may be any linear or non-linear function or algorithm, for example classifier, regression, machine learning, artificial intelligence, average, mean weighted average, weighted mean, median, ignoring outliers.

In some embodiments, the process further comprises the blocks 305 and 306.

In block 305, a new value of loaded resistance is calculated and compared to a threshold value. The threshold value may be a fraction and/or a multiple of the referenced loaded resistance value, a user input parameter, a default value stored in memory 122, and/or a combination thereof. If the new value exceeds the threshold value, continue to block 306, otherwise return to block 305. The loop of repeating block 305 may be exited when processor 105 detects a change in input current and/or voltage drop and calculates returns to block 300 to calculate a new loaded resistance value.

In block 306 an alarm and/or alert is generated by processor 105 and transmitted by communications interface 106 as described above.

HARDWARE EMBODIMENTS

For example, hardware for performing selected tasks according to embodiments of the invention could be implemented as a chip or a circuit, or a virtual machine or virtual hardware. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, non-transitory storage media such as a magnetic hard-disk and/or removable media, for storing instructions and/or data. Optionally, a network connection is provided as well. A display and/or a user input device such as a keyboard or mouse are optionally provided as well.

For example, any combination of one or more non-transitory computer readable (storage) medium(s) may be utilized in accordance with the above-listed embodiments of the present invention. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable non-transitory storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

As will be understood with reference to the paragraphs and the referenced drawings, provided above, various embodiments of computer-implemented methods are provided herein, some of which can be performed by various embodiments of apparatuses and systems described herein and some of which can be performed according to instructions stored in non-transitory computer-readable storage media described herein. Still, some embodiments of computer-implemented methods provided herein can be performed by other apparatuses or systems and can be performed according to instructions stored in computer-readable storage media other than that described herein, as will become apparent to those having skill in the art with reference to the embodiments described herein. Any reference to systems and computer-readable storage media with respect to the following computer-implemented methods is provided for explanatory purposes, and is not intended to limit any of such systems and any of such non-transitory computer-readable storage media with regard to embodiments of computer-implemented methods described above. Likewise, any reference to the following computer-implemented methods with respect to systems and computer-readable storage media is provided for explanatory purposes, and is not intended to limit any of such computer-implemented methods disclosed herein.

Explanations of Figures

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Clarifications

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, the singular form "a", "an" and "the" include plural references unless the context clearly dictates otherwise.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination or as suitable in any other described embodiment of the invention. Certain features described in the context of various embodiments are not to be considered essential features of those embodiments, unless the embodiment is inoperative without those elements.

The above-described processes including portions thereof can be performed by software, hardware and combinations thereof. These processes and portions thereof can be performed by computers, computer-type devices, workstations, processors, micro-processors, other electronic searching tools and memory and other non-transitory storage-type devices associated therewith. The processes and portions thereof can also be embodied in programmable non-transitory storage media, for example, compact discs (CDs) or other discs including magnetic, optical, etc., readable by a machine or the like, or other computer usable storage media, including magnetic, optical, or semiconductor storage, or other source of electronic signals.

The processes (methods) and systems, including components thereof, herein have been described with exemplary reference to specific hardware and software. The processes (methods) have been described as exemplary, whereby specific steps and their order can be omitted and/or changed by persons of ordinary skill in the art to reduce these embodiments to practice without undue experimentation. The processes (methods) and systems have been described in a manner sufficient to enable persons of ordinary skill in the art to readily adapt other hardware and software as may be needed to reduce any of the embodiments to practice without undue experimentation and using conventional techniques.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method comprising:
   sampling a voltage drop between an input point and an output point within a breaker box for at least one circuit;
   detecting one said circuit with an increased voltage drop above a threshold value;
   sampling an input current at an input point of the breaker box, said input point connected to a same phase as said increased voltage drop; and
   when said input current increases and has a sufficiently similar phase angle and time synchronization as said increased voltage drop;
   calculating a loaded resistance of said detected circuit by dividing said detected increased voltage drop by said increased current, and, generating an indication of the loaded resistance.

2. The method of claim 1, wherein said calculating of said loaded resistance further comprises calculating a plurality of values of loaded resistance, and a reference value of loaded resistance is calculated by a mathematical function performed on said plurality of loaded resistance values.

3. The method of claim 2, wherein said mathematical function is chosen from a group including mean, average, weighted average, weighted mean, median, and/or ignoring outliers.

4. The method of claim 1, wherein said at least one circuit belongs to a single phase of a three-phase signal.

5. The method of claim 1, said detecting of one circuit with an increased voltage drop corresponding to said increase in input current further comprising correlating a timing and a phase angle between said increased voltage drop and said increase in input current.

6. The method of claim 1, wherein if the indication of the loaded resistance increases above a threshold value than an alarm is operated.

7. A method comprising:
   sampling a voltage drop within a breaker box for at least one circuit from a plurality of circuits;
   detecting a circuit among said at least one circuit with an increased voltage drop between an input point and an output point of said breaker box, said voltage drop above a threshold value in a specific electrical phase;
   sampling an input current to said breaker box of said specific electrical phase as said increased voltage drop; and
   if no increased current occurred corresponding in both time synchronization and phase angle to said increased voltage drop;
   generating an alarm.

8. The method of claim 7, further comprising generating an alarm when a resistance of said circuit calculated by dividing said voltage drop by said increased current is above a threshold level of a loaded resistance for said detected circuit.

9. The method of claim 7, further comprising generating an alarm when said increased current is greater than a threshold percentage of a maximum value for current in a circuit breaker for said detected circuit.

10. The method of claim 7, further comprising calculating a power consumption of at least one circuit in said breaker box by continuously multiplying a detected voltage drop by corresponding increased current, and when said power consumption is greater than a threshold value performing at least one action chosen from a list of actions including generating an alarm, storing a time series of said power consumption values, and reporting in real-time said power consumption values.

11. The method of claim 7, further comprising generating a time series data base of values of said sampled current for at least one of said plurality of circuits.

12. A system for detecting faults in a breaker box comprising:
   a processor comprising a CPU, a communications interface, and a memory;
   a voltage sampling interface connected to entry points and exit points of circuits within said breaker box;
   a voltage comparator for measuring a voltage drop from said entry point and said exit point voltages; and
   a current sampling interface; wherein
   said processor being programmed with executable instructions to receive time series of current data, sampled at an input point of the breaker box, and corresponding voltage drop data, sampled between an input point and an output point within the breaker box, for said at least one circuit, to calculate a loaded resistance of said at least one circuit by dividing said voltage drop by said current data, and to generate an indication of the loaded resistance.

13. The system of claim 12, further comprising generating an alarm when a resistance of said circuit calculated by dividing said voltage drop by said increased current is above a threshold level of a loaded resistance of said circuit.

14. The system of claim 12, further comprising generating an alarm when said increased current is greater than a threshold percentage of a maximum value for current in a circuit breaker for said circuit.

15. The system of claim 12, further comprising calculating a power consumption of at least one circuit in said breaker box by continuously multiplying a detected voltage drop by corresponding increased current, and performing at least one action chosen from a list of actions including generating an alarm when said power consumption is greater than a threshold value, storing a time series of said power consumption values, and reporting in real-time said power consumption values.

16. The system of claim 12, further comprising generating a time series data base of values of said current sampling for at least one of said circuits.

17. The system of claim 12, wherein said calculating of said loaded resistance further comprises calculating a plurality of values of loaded resistance, and a final value of a loaded resistance is calculated by a mathematical function performed on said plurality of values.

18. The system of claim 17, wherein said mathematical function is chosen from a group including mean, average, weighted average, weighted mean, median, and/or ignoring outliers.

19. The system of claim 12, wherein said at least one circuit belongs to a single phase of a three-phase signal.

20. The system of claim 12, said detecting of one circuit with an increased voltage drop corresponding to said increase in input current further comprising correlating a timing and a phase angle between said increased voltage drop and said increase in input current.

* * * * *